United States Patent [19]

[11] 4,195,257

Yoshida et al.

[45] Mar. 25, 1980

[54] TESTING APPARATUS FOR A CIRCUIT ASSEMBLY

[75] Inventors: Susumu Yoshida; Kiyomitu Kimura, both of Tokyo, Japan

[73] Assignee: Kabushiki Kaisha Meidensha, Tokyo, Japan

[21] Appl. No.: 745,823

[22] Filed: Nov. 29, 1976

[30] Foreign Application Priority Data

Dec. 4, 1975 [JP] Japan .......................... 50/165135[U]
Feb. 5, 1976 [JP] Japan .......................... 51/12045

[51] Int. Cl.[2] .......................... G01R 15/12
[52] U.S. Cl. .......................... 324/73 R
[58] Field of Search .......................... 324/73 R, 73 PC; 35/19 A

[56] References Cited

U.S. PATENT DOCUMENTS

| | | | |
|---|---|---|---|
| 3,398,363 | 8/1968 | Mortley | 324/73 |
| 3,723,867 | 3/1973 | Canarutto | 324/73 PC |
| 3,970,929 | 7/1976 | Borucki et al. | 324/73 R |
| 4,002,972 | 1/1977 | Konrad et al. | 324/73 R |

FOREIGN PATENT DOCUMENTS

| | | | |
|---|---|---|---|
| 1345582 | 1/1974 | United Kingdom | 324/73 R |

*Primary Examiner*—M. Tokar
*Attorney, Agent, or Firm*—Haseltine, Lake & Waters

[57] ABSTRACT

A testing apparatus for testing an assembly containing multiple circuits such as, for example, a control circuit for an electrically driven vehicle. The testing apparatus comprises a displaying panel member which includes a drawing illustrating a circuit assembly to be tested, an indicating element member having at least one indicating lamp which is positioned at the corresponding position of the drawing, an actuating circuit member for actuating the indicating member and a connecting member which includes a connector for electrically connecting the actuating circuit member to the assembly to be tested. In making an actual test, the corresponding portion of the circuit assembly to be tested is connected to a connector of the connector member at the same time, an external connector of the connector member is connected to the corresponding portion of the circuit assembly for electrically connecting the actuating circuit member, the indicating element member and the circuit assembly to be tested, to each other and a corresponding abnormal portion of the circuit assembly is indicated at a corresponding portion of the drawing provided in the indicating panel member, in response to a malfunction of the assembly to be tested.

6 Claims, 13 Drawing Figures

TESTING APPARATUS FOR A CIRCUIT ASSEMBLY

BACKGROUND OF THE INVENTION

This invention relates to a testing apparatus and more particularly, to a testing apparatus for an electrically driven vehicle or an assembly containing multiple circuit.

In the past, a number of systems have been proposed for testing an electric circuit, an assembly containing multiple circuits and the like. Even when an electric circuit arrangement containing only a simple circuit is tested, this can not be easily accomplished because various types of the testers are necessary as well as high level professional knowledge and very great skill .

Particularly, in testing an electric circuit of a moving body such as, for example, an electrically driven vehicle, the operation of such systems has typically been adversely affected by the various conditions. Further, such systems typically provided only an indication of the condition of the electric circuit so that an accurate examination result can not be obtained if the vehicle is actually operated. And more particularly, in making various types of apparatus, many types of testers are required because the source power voltages of such apparatus are different in each. Prior art solutions of this problem, therefore, have tended to be complex and cumbersome.

SUMMARY OF THE INVENTION

Among the several objects of the present invention may be noted the provision of a testing apparatus which will provide a very accurate indication of the condition of an electric circuit; the provision of such testing apparatus which is unaffected by variable operating conditions; the provision of such testing apparatus which does not itself require a high level professional knowledge and very great skill; the provision of such apparatus which is reliable and which is relatively simple and inexpensive. Other objects and features will be in part apparent and in part pointed out hereinafter.

DESCRIPTION OF THE PREFERRED EMBODIMENTS

Figure 1:
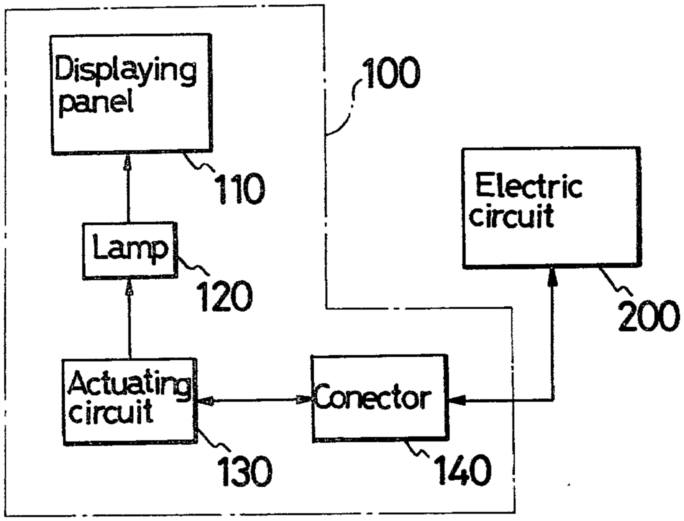
FIG. 1 is a block diagram illustrating the operation of a testing apparatus of this invention.

Referring now to FIG. 1 there is indicated at 100 a testing apparatus of the present invention, the testing apparatus comprising a displaying panel member 62 which includes a circuit drawing 62*a* of an circuit to be tested, a indicating lamp member ED having at least one indicating lamp which is positioned at a corresponding position of the drawing of the circuit to be tested as will be explained later with reference to FIGS. 5 and 7, an actuating circuit member 65 for actuating the indicating lamp member and a connecting member for electrically connecting the actuating circuit member 65 to an electrical circuit 200 to be tested.

Figure 2:
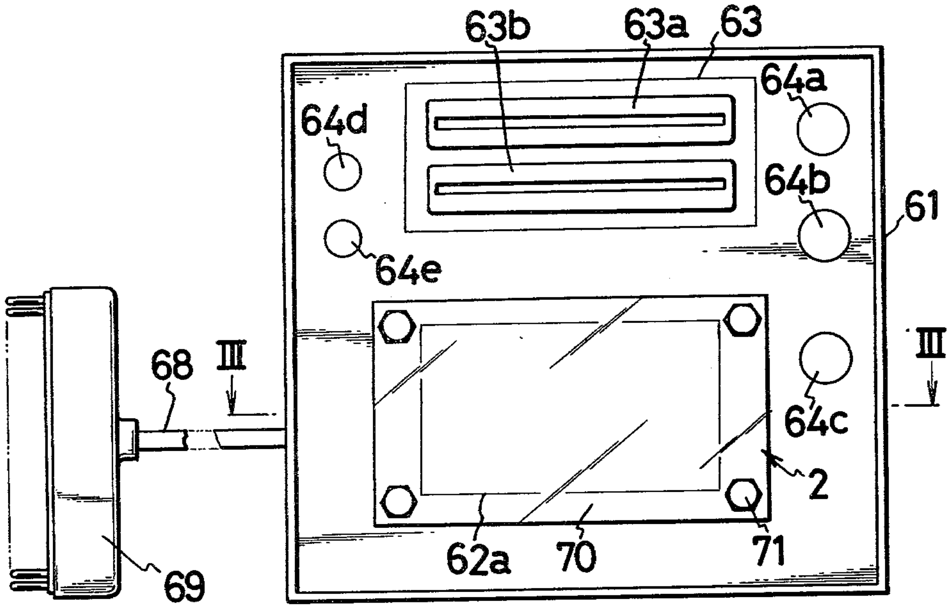
FIG. 2 is an elevational view of a testing apparatus of the invention.
Figure 3:
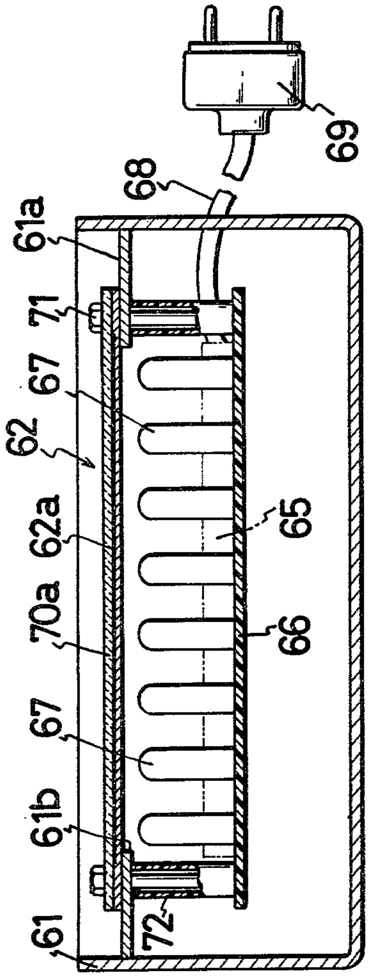
FIG. 3 is a cross sectional view taken along line III—III in FIG. 2.
Figure 4:
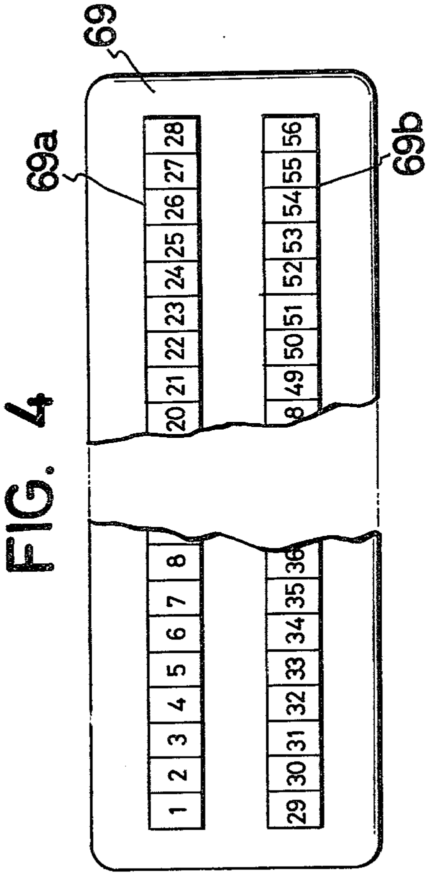
FIG. 4 is an elevational view of an external connector which is employed in the testing apparatus.

FIGS. 2 through 4 show a mechanical construction of a testing apparatus in accordance with the present invention, and as is best shown in FIGS. 2 and 3, at an upper surface 61*a* of a casing 61 is a test circuit display panel 62, a first connector 63 which includes sockets 63*a* and 63*b* and pre-checking means which includes pushbutton switches 64*a* through 64*e*. An actuating circuit 65 for controlling lamps 67 in the display panel 62 is mounted in the casing 61. An opening 61*b* is provided on the upper surface 61*a* of the casing 61. An indicating panel 70 is mounted in the opening 61*b*. The indicating panel 70 includes a transparent plate 70*a* and a printing base board 66 fastened to the indicating panel 70 by means of a plurality of nuts 71 and spacers 72. An external (second) connector 69 is connected to the actuating circuit 65 by means of a multi cable 68 and to the connector 63 and the actual external circuit to be tested as will be explained later. The external connector 69 has plugs 69*a* and 69*b* as is shown in FIG. 4. The plug 69*a* has a plurality of terminals 1 through 28, and the plug 69*b* has terminals 29 through 56.

Figure 5:
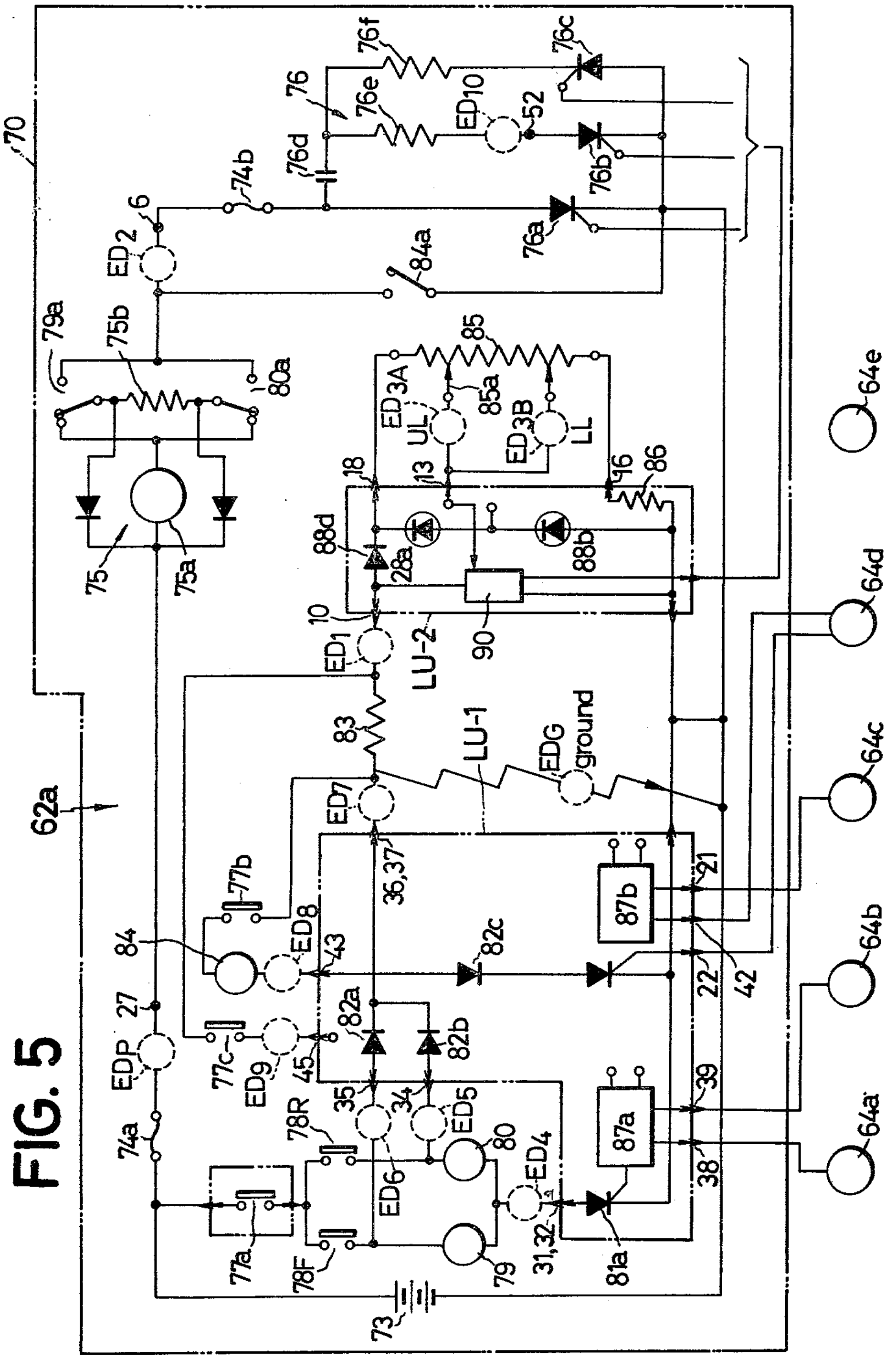
FIG. 5 is an elevational view of an indicating panel which has a circuit drawing of a control circuit arrangement to be tested.

As is best shown in FIG. 5, a drawing 62*a* of a circuit to be tested is attached to the panel plate 70*a*. The drawing 62*a* of a control apparatus of the electrical operated vehicle is hereinafter described specifically by referring to FIG. 7. The indicating lamps 67 which include a plurality of light emitting diodes $ED_1$-$ED_{10}$, $ED_P$ and $ED_G$ are respectively positioned at the corresponding positions with respect to loops of the drawing 62*a*. That is to say, the light emitting diode $ED_4$ is positioned at a loop formed by relays 79 and 80 and a first thyristor 81*a*, the light emitting diode $ED_5$ is situated at the loop formed by a junction of a switch 78R and the relay 80 and a diode 82*b*, and the light emitting diode $ED_6$ is positioned at a loop of a junction between a switch 78F and the relay 79 and diode 82*a*. The diode $ED_7$ is positioned at a loop line connecting a resistor 83 and the diodes 82*a* and 82*b*, and the diode $ED_G$ is situated to a loop line drawn between the resistor 83 and a negative terminal of a battery 73, and the diode $ED_1$ is positioned at a loop between a diode 82*d* and the resistor 83. The light emitting diodes $ED_{3A}$ and $ED_{3B}$ are respectively situated at corresponding portions of a top 85*a* of an accelerator potentiometer 85. The diode $ED_8$ is situated at the loop line between a relay 84 and a diode 82*C*, and the diode $ED_9$ is positioned at a loop line connecting a switch 77*c* and a logic unit LU-1. The diode $ED_P$ is situated at a loop formed by a positive terminal of the battery 73, a fuse 74*a* and an electric motor 75, and diode $ED_2$ is positioned at a loop line connecting a contact 84*a* and a fuse 74*b*, and the light emitting diode $ED_{10}$ is positioned below the line between a reactor 76*e* and thyristor 76*b* of a chopper 76.

Figure 6A:
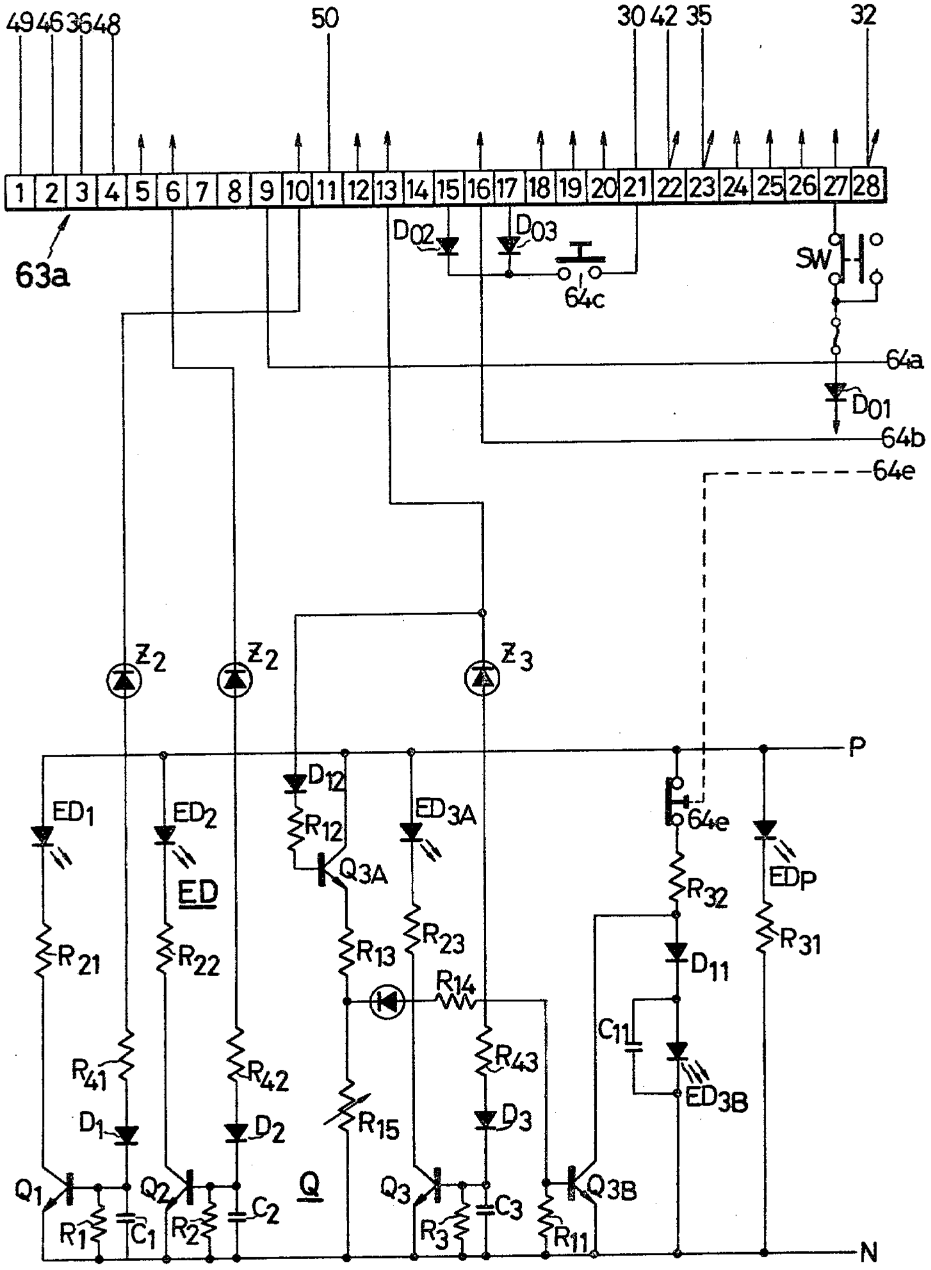
FIGS. 6A through 6C are circuit diagrams of an actuating circuit of the testing apparatus in accordance with the present invention.
Figure 6B:
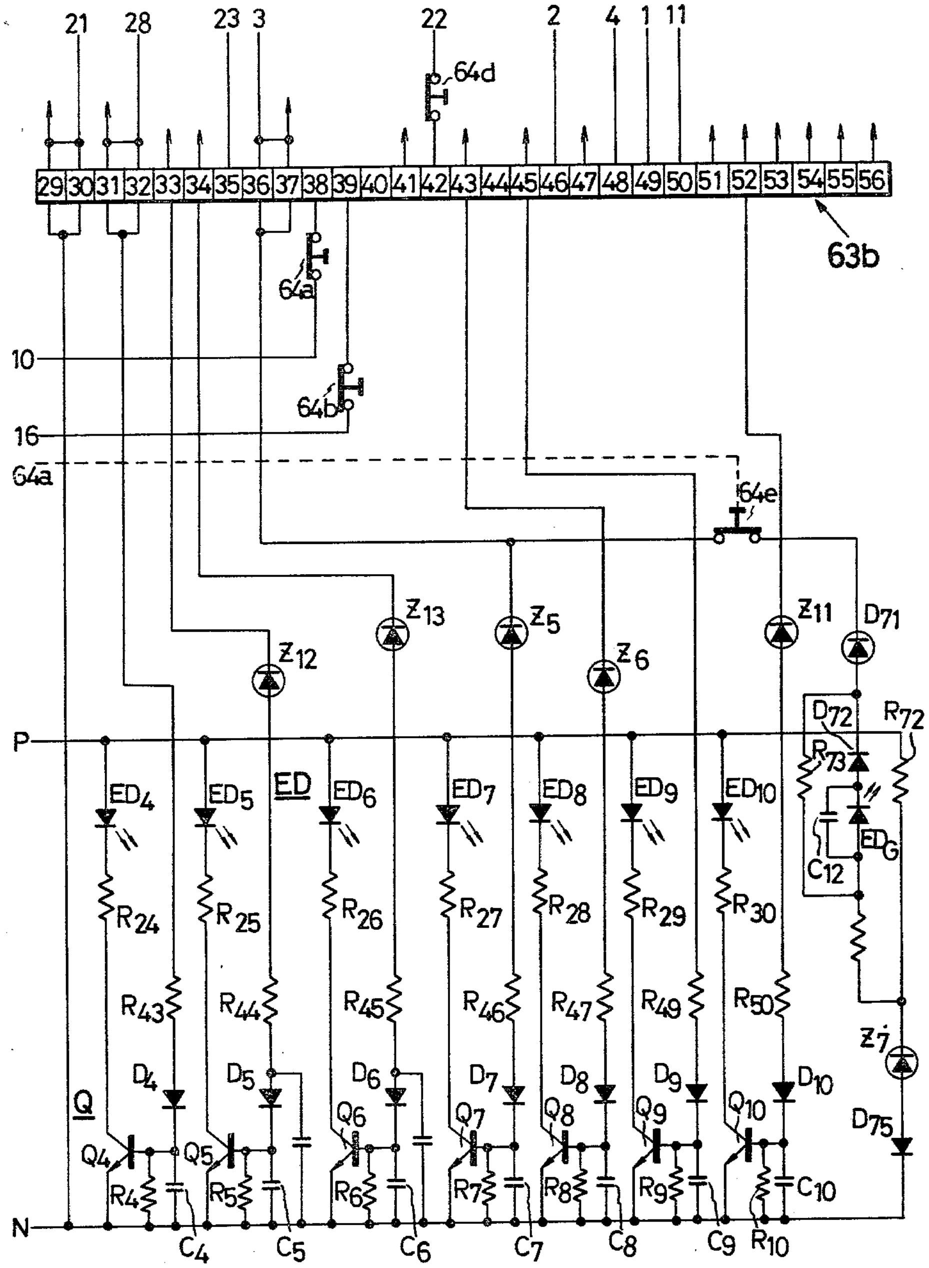
Figure 6C:
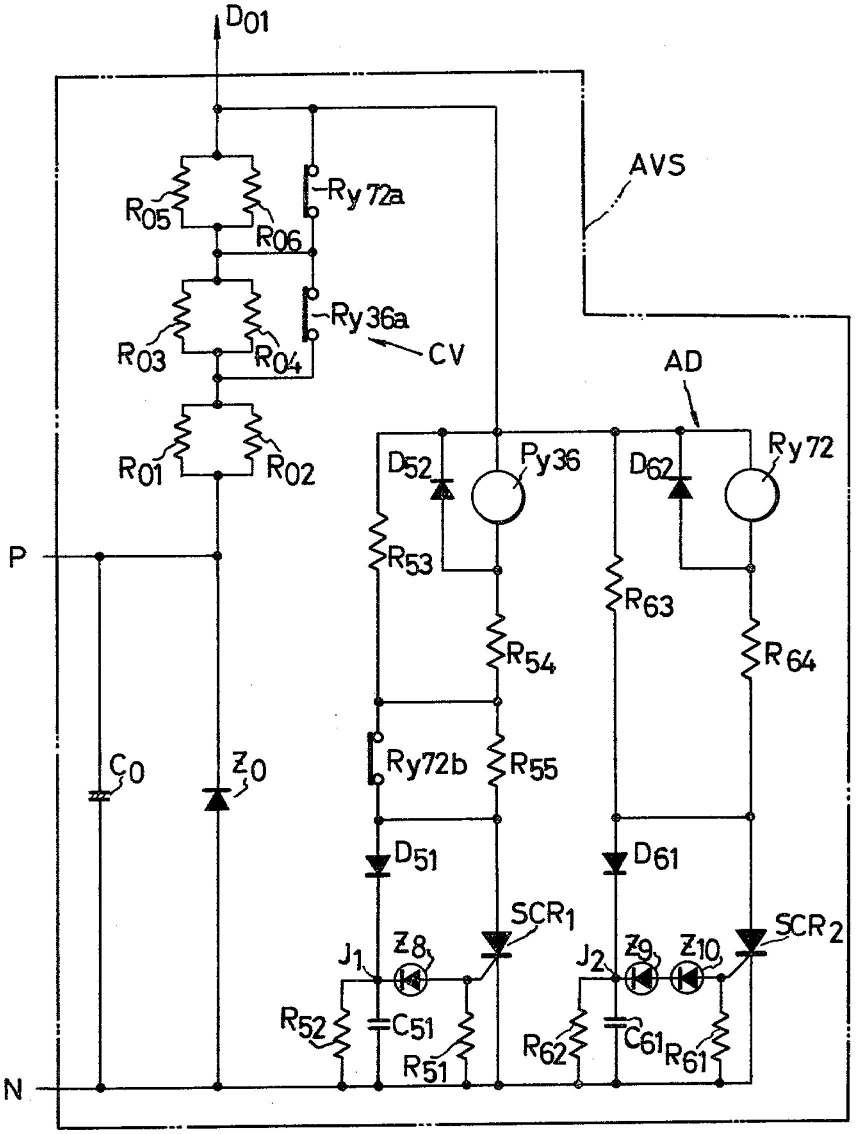

As is best shown in FIGS. 6A through 6C, the sockets 63*a* and 63*b* have, respectively, a plurality of terminals 1–28 and 29–56. Between the sockets 63*a* and 63*b*, the succeeding terminals 1 to 4, 11, 21–23 and 28 of the socket 63*a* are respectively interconnected to the corresponding terminals of the socket 63*b* as indicated by reference numerals in FIGS. 6A and 6B.

On the other hand, the terminals 5, 6, 10, 12, 13, 16, 18–20 and 22–28 of the socket 63*a* are, respectively, interconnected to the same numbered terminals of the plug 69*a* of the external connector 69. Adjacent succeeding terminals 29,30,31,32,35,36,37,42,46,48,49 and are respectively, connected to the corresponding same numbered terminals of the plug 69*b* of the external connector 69.

As is best shown in FIGS. 6A to 6C, the actuating circuit 65 comprises lamp member ED which includes light emitting diodes $ED_1$–$ED_{10}$, $ED_{3A}$, $ED_{3B}$, $ED_P$ and $ED_G$, a voltage detecting member Q which includes transistors $Q_1$–$Q_{10}$, $Q_{3A}$ and $Q_{3B}$ and a voltage setting circuit AVS which consists of a constant voltage setting circuit CV for applying the constant voltage to the lamp member ED and the voltage detecting member Q and a voltage changeover circuit AD for supplying a constant current to the constant voltage setting circuit CV. Furthermore, the light emitting didodes $ED_1$–$ED_{10}$, $ED_3$, $ED_{3B}$, $ED_P$ and $ED_G$ are, respectively, connected to the collector-emitter paths of corresponding transistors $Q_1$–$Q_{10}$, $Q_{3A}$, $Q_{3B}$ in series relationship. The light emitting diode $ED_1$ is connected to the terminal 10 of the connectors 63 and 69 by way of a collector-base path the transistor $Q_1$, a diode $D_1$, resistor $R_{41}$ and a zener diode $Z_1$, and the light emitting diode $ED_2$ is connected to the terminal 6 of the connectors 63 and 69 via the transistor $Q_2$, diode $D_2$, a resistor $R_{42}$ and a zener diode $Z_2$. The light emitting diodes $ED_{3A}$ and $ED_{3B}$ are connected to the terminal 13, and the light emitting diode $ED_P$ is connected between a positive terminal P and a negative terminal N across a resistor $R_{31}$.

Referring to FIG. 6B, the negative terminal N is in the same way connected to the terminals 29 and 30, of the connectors 63 and 69 while the light emitting diode $ED_4$ is connected between the positive terminal P and the negative terminal N via a resistor $R_{24}$ and the transistor $Q_4$, and a base electrode of the transistor $Q_4$ is connected to the terminals 31 and 32 of the connectors 63 and 69 via a diode $D_4$ and a resistor $R_{43}$, and the light emitting diode $ED_5$ is connected between the positive terminal P and the negative terminal N by way of a resistor $R_{25}$ and the transistor $Q_5$, and a base electrode of the transistor $Q_5$ is connected to the terminal 33 of the connectors 63 and 69 via a diode $D_5$, a resistor $R_{44}$ and a zener diode $Z_{12}$. In the same manner, the other light emitting diodes $ED_6$–$ED_{10}$ and $ED_G$ are respectively connected between the positive terminal P and the negative terminal N via the corresponding resistors and transistors, and each of the base electrodes of the transistors are respectively connected to the corresponding terminals of the socket 63*b*. In the same way, other circuit components are connected as shown in FIG. 6A and 6B.

It will be observed that, in the constant voltage setting circuit CV, the constant voltage element such as, for example, the zener diode Zo and the capacitor Co are connected between the terminals P and N and are connected by way of the resistors $R_{01}$–$R_{06}$ diode $DO_1$ and switch Sw to the terminal 27 of the socket 63*a* (see FIG. 6*a*) of the connector 63 and the terminal 27 of the plug 69*a* of the connector 69. It will be observed that, the voltage changeover circuit AD, is connected in parallel to the constant voltage setting circuit CV. The voltage changeover circuit AD comprises a relay circuit which consists of the preset rated voltage relay $Ry_{36}$ resistors $R_{54}$ and $R_{55}$ and a switching element such as, for example, the thyristor $SCR_1$ and a relay circuit which comprises a preselected rated voltage relay $Ry_{72}$, a resistor $R_{64}$ and a switching element such as, for example, the thyristor $SCR_2$. In the circuit AD, a relay circuit is comprised by a resistor $R_{53}$, a contact $Ry_{72b}$ of the relay $Ry_{72}$, a diode $D_{51}$ and a capacitor $C_{51}$, and a junction of the resistor $R_{53}$ and the contact $Ry_{72b}$ is connected to a junction of the resistors $R_{54}$ and $R_{55}$. A junction of the contact $Ry_{72b}$ and the diode $D_{51}$ is connected to a junction of the resistor $R_{55}$ and the thyristor $SCR_1$, and further a zener diode $Z_8$ whose zener voltage is E is connected between a junction $J_1$ of the diode $D_{51}$ and the capacitor $C_{51}$ and a gate electrode of the thyristor $SCR_1$. A relay circuit is comprised by a resistor R63, a diode $D_{61}$ and a capacitor $C_{61}$. A junction of the resistor $R_{63}$ and the diode $D_{61}$ is connected to a junction of the resistor $R_{64}$ and the thyristor $SCR_2$. Two series connected zener diodes $Z_9$ and $Z_{10}$ whose zener voltage are 2E are connected between a junction $J_2$ and a gate electrode of the thyristor $SCR_2$.

In the constant voltage setting circuit CV, a normal closed contact $Ry_{36}a$ of the relay $Ry_{36}$ is connected in parallel to the resistors $R_{03}$ and $R_{04}$, and a normal closed contact $Ry_{72}a$ of the relay $Ry_{72}$ is connected in parallel to the resistors $R_{05}$ and $R_{06}$.

As is shown in FIGS. 6A and 6B, a push-button switch 64*a* is connected between the terminal 38 of the socket 63*b* and the terminal 9 of the socket 63*b* of the connector 63. A push-button switch 64*b* is connected between the terminal 39 of the socket 63*b* of the connector 63*b* and the terminal 16 of the connector 63*a*. A push-button switch 64*c* is connected between the terminal 21 and terminals 15 and 17 of the connector 63*a* by way of diodes $D_{02}$ and $D_{03}$ (see FIG. 6A). A push-button switch 64*d* is connected between the terminal 42 of the socket 63*b* and the terminal 22 of the socket 63*a* of the connector 63. One of push-button switches 64*e* is connected between terminals 36, 37 of connector 63*b* and the light emitting diode $ED_G$ by way of zener diode $D_{71}$ and a diode $D_{72}$, and other push switch 64*e* is connected between terminal P and the light emitting diode $ED_{3B}$ by way of a resistor $R_{32}$ and a diode $D_{11}$.

Figure 7:
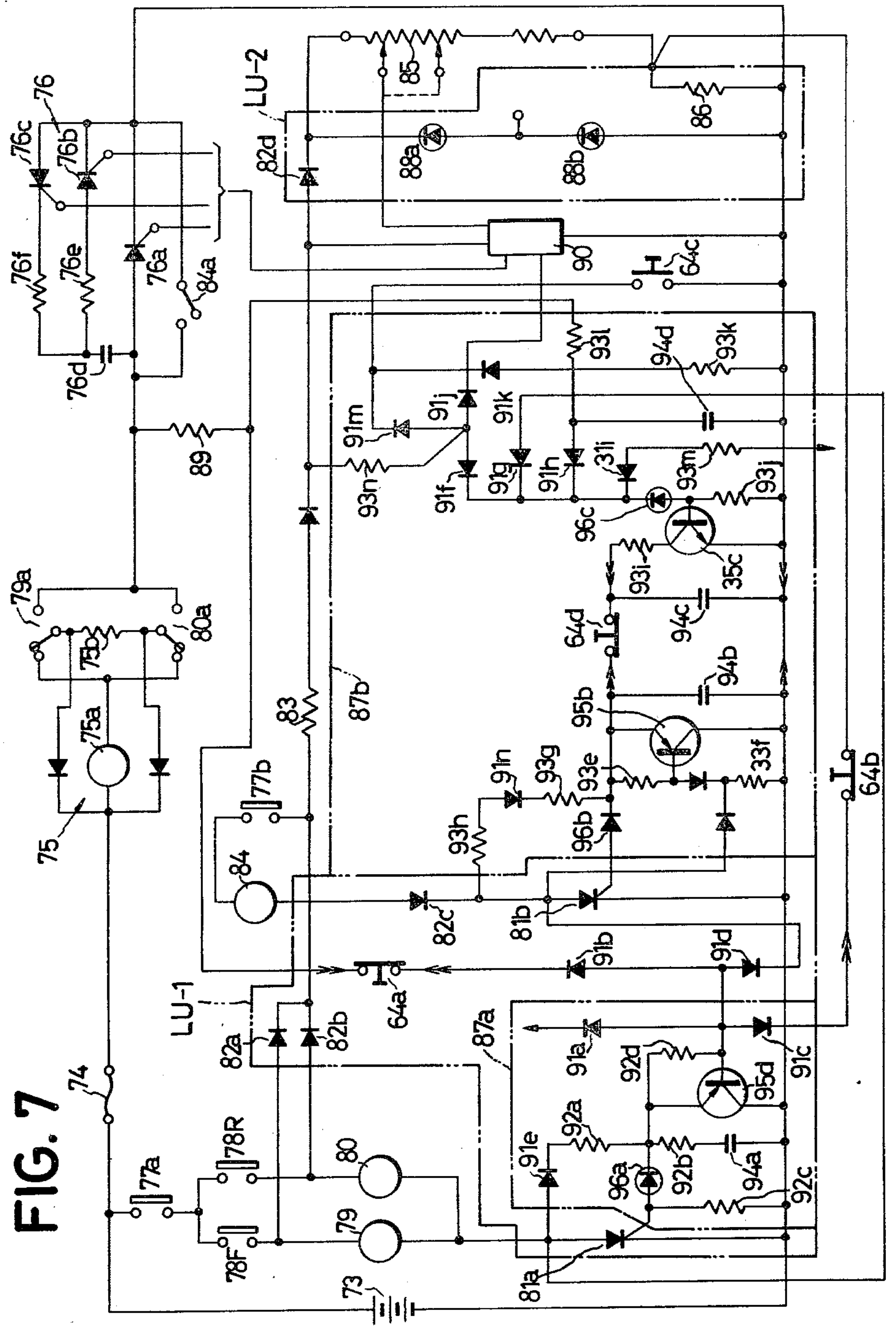
FIG. 7 is a circuit diagram of a control apparatus to be tested.

FIG. 7 shows a circuit of the control apparatus of the electric operated vehicle to be tested. The control apparatus comprises; substantially, a direct current power supply in the form of a battery 73, a main circuit which consists of a fuse 74*a*, an electric motor 75 which includes an armature 75*a* and a field winding 75*b*, a change-over switch 79*a* of a relay 79, a changeover switch 80*a* of a relay 80 and a chopper circuit 76 which includes a main thyristor 76*a*, auxiliary thyristors 76*b* and 76*c*, a capacitor 76*d* and reactors 76*e* and 76*f*; and a control circuit which comprises a first accelerator switch 77*a* operated by an accelerator pedal (not shown in the drawing), manual switches 78F and 78R, relays 79 and 80, a second accelerator switch 77*b*, a relay 84 an accelerator resistor 85, and logic units LU-1 and LU-2.

The logic unit LU-1 comprises a first thyristor 81*a*, a monitor circuit 87*a* for monitoring the conducting condition of the thyristor 81*a*, diode 82*a*–82*c*, 91*b* and 91*d*, a second thyristor 81*b* and a monitor circuit $\mathbf{87}b_1$ for monitoring the conducting condition of the second thyristor 91*b*. The monitor circuit 87*a* includes diodes 91*a*–91*e*, resistors 92*a*–92*d*, a zener diode 96*a*, a capacitor 94*a*, a transistor 95 and so forth. On the other hand, the monitor circuit $87b_1$ includes resistors 93*e*–93*h*, a diode 91*n* a zener diode 96*b*, a transistor 95*b*, a capacitor 94*b* and the like, and is connected as shwon in FIG. 7.

Specifically, in the monitor circuit 87*a*, a base electrode of the transistor 95*a* is connected to the anode electrode of the diodes 31*a*–31*d*, the diode 91*a* is connected to another circuit such as an automatic breaking circuit (not shown in the drawings). The logic unit LU-2 comprises a monitor circuit $87b_2$ for monitoring the condition of the chopper circuit 76, a diode 82*d*, an auxiliary resistor 86, zener diodes 88*a* and 88*b*, a resistor 89, an oscillator circuit 90 and the like, and is connected as shown. The monitor circuit $87b_2$ includes diodes 91*f*–91*n*, resistors 93*j*–93*n*, a transistor 85*c*, a capacitors 94*c*–94*d*, a zener diode 96*c* and the like, and is connected as shown.

In the monitor circuit 87*b*, to a base electrode of the transistor 95*c* is connected the diodes 91*f*–91*i* via a zener diode 96*c* and, further, a push-button switch 64*c* is connected between an anode electrode of the diode 91*f* and a negative terminal of the battery 73 via a diode 91*m*. The diode 91*g* is connected to an anode electrode of the thyristor 81*a*, while the diode 91*h* is connected to the anode electrode of the main thyristor 76*a* of the chopper circuit 76 via the resistor 93*l* and the resistor 89, and, the diode 91*i* is connected to the automatic breaking circuit.

Figure 8:
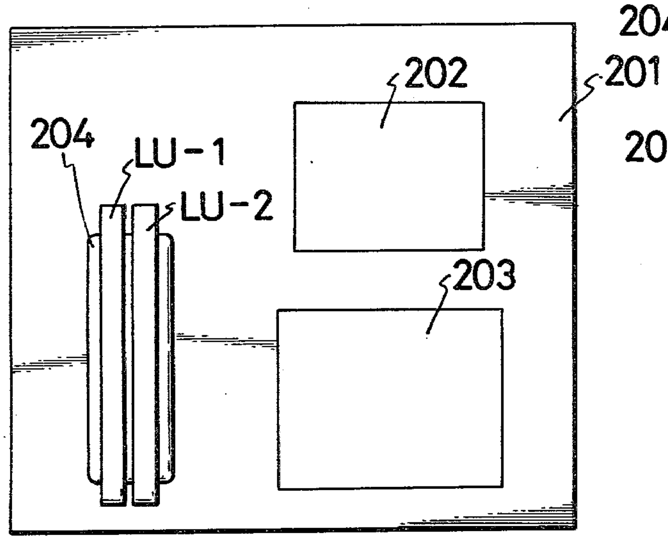
FIG. 8 is a simplified construction of the control apparatus of FIG. 7.

The control circuit and the chopper circuit shown in FIG. 7 are divided into a circuit element unit 202 which includes capacitors, reactors and the like and a semiconductor element unit 203 which includes thyristors, diodes and the like, and these units 202 and 203 are mounted on the insulating board 201. And, morefurther, a connector member 204 is provided on the insulating board 201, as is best shown in FIG. 8. The logic units LU-1 and LU-2 are inserted to the connector member 204. The insulating board 201 is mounted on the electric motor operated vehicle.

Figure 9:
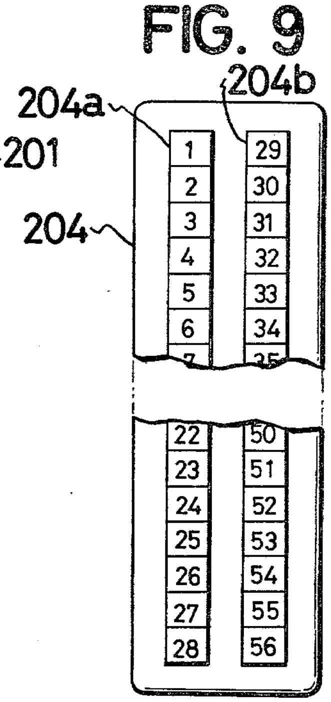
FIG. 9 is an elevational view of a connector which is employed in the apparatus to be tested.
Figure 10:
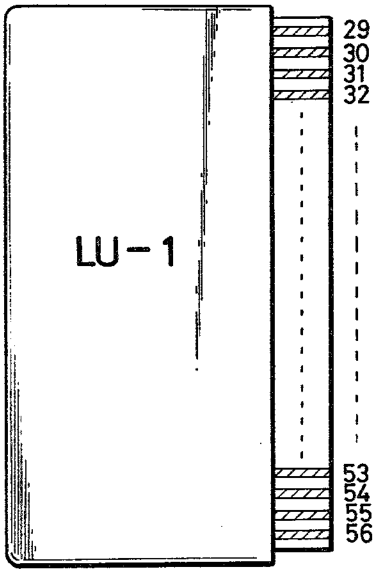
FIGS. 10 and 11 are, respectively, side views of logic units of the control circuit arrangement to be tested.
Figure 11:
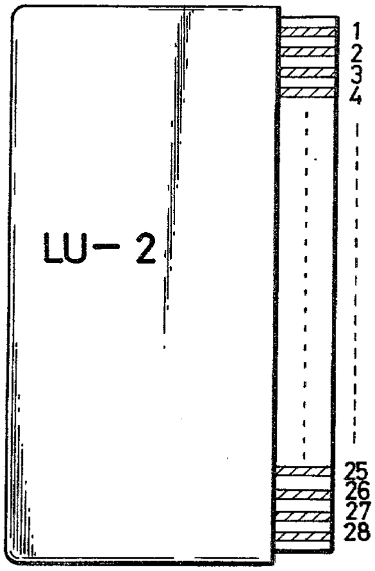

The connector member 204 has a sockets 204*a* and 204*b*, and the socket 204*a* has a plurality of terminals 1–28 and the socket 204*b* has terminals 29–56, as is shown in FIG. 9. As is shown in FIG. 10, the logic unit LU-1 has a plurality of terminals 29–56, and the logic unit LU-2 has also a plurality of terminals 1–29 as is shown in FIG. 11.

When the logic units LU-1 and LU-2 are inserted into the sockets 204*a* and 204*b*, the logic units LU-1 and LU-2 of the control apparatus are connected as shown in FIG. 7. Specifically, in the logic unit LU-1, an anode electrode of the first thyristor 81*a* is connected to the relays 79 and 80 by way of the terminal 31 of the logic unit LU-1 and the terminal 32 of the socket 204*b*. The diode 82*a* is connected to a junction between the switch 78F and the relay 79 by way of the terminal 34 of the socket 204*b*, and the diode 82*b* is connected to a juncture of the switch 78R and the relay 80 by way of terminals 33 of the logic unit LU-1 and the socket 204*b*. As is shown by a full line 11*a*, the diode 91*b* is connected to the terminal 9 of the logic unit LU-1 and the terminal 9 of the socket 204*a* by way of the terminal 38, of the logic unit LU-1 and the terminal 38 of socket 204*b*. The diode 82*c* is connected to the relay 84 by way of the terminal 43 of the logic unit LU-1 and the terminal 43 of the socket 204*b*. The diodes 82*a*, 82*b* are connected to the terminals 36,37 of the logic unit LU-1, and the terminals 36, 37 are connected to the terminals 36, 37 of the socket 204*b*. Accordingly, each of the diodes 82*a*, 82*b* is connected to the resistor 83 by way of the terminals 36, 37 respectively of the logic unit LU-1 and the socket 204*b*. A collector electrode of the transistor 85*b* and the capacitor 94*b* are connected to the terminal 42 of the logic unit LU-1 and the corresponding terminal 42 of the socket 204*b* through a line 12*a*. The diode 91*c* is connected to the terminal 39 of the logic unit LU-1 and the corresponding terminal 39 of the socket 204*b*.

In the logic unit LU-2, the resistor 93*i* is connected to the terminal 22 of the logic unit LU-2 which is connected and inserted into the terminal 22 of the socket 204*a* of the connector 204. The resistor 89 is connected to the terminal 6 of the logic unit LU-1 and the similar terminal of socket 204*a*. The diode 82*b* is connected to the terminals 18 of the logic unit LU-2 of the socket 204*a*. The oscillating circuit 90 is connected to the terminals 16 and the logic unit LU-2 and that of the socket 204*a*. An emitter electrode of the transistor 95*c* is connected to the terminal 21 of the logic unit LU-2 and that of the socket 024*a*.

In making a test, the logic units LU-1 and LU-2 are removed from the connector member 204, and the logic unit LU-1 is plugged into the socket 63*b* and the logic unit LU-2 is plugged into the socket 63*a* and the connector 63. Thereafter the external connector 69 is connected to the connector member 204. In this case, the control circuit and logic units LU-1 and LU-2 of the vehicle and the actuating circuit 65 of the tester are electrically connected to each other by means of the connector members.

In this condition, when the electrically operated vehicle is actually driven, each light emitting diode flickers in accordance with the corresponding driving mode of the vehicle and, at the same time, is displayed on the display panel 70.

When the logic units LU-1 and LU-2 are connected to the sockets 63*a* and 63*b* and, at the same time, the external connector 69 is connected to the connector 204, the first thyristor 81*a* is connected to the relays 79 and 80 via the terminals 31 and 32 of the unit LU-1, the terminals 31 and 32 of the socket 63*b* and the terminals 31 and 32 of the external connector 69. The junction of the switch 78R and the relay 80 is connected to the diode 82*b* by way of the terminal 34 of the external connector 69, the terminal 34 the socket 63*b* of the connector 63 and the terminal 34 of the logic unit LU-1. The junction located between the switch 78R and the relay 79 is connected to the diode 82*a* via the each terminal 34 of the each connector, and, in the same manner, each junction point indicated by the terminal numbers (36, 37), 43, 45 and 52 is connected to the corresponding parts by way of the corresponding terminals of the logic unit LU-1 and the connectors 69 and 63.

On the other hand, the junction of the contact 84*a* and the fuse 74*b* is connected by each corresponding terminal 6 of the connector 204 and the external connector 69 to the terminal 6 of the connector 63, and the resistor 83 is connected to the diode 82*d* of the logic unit LU-2 by way of each corresponding terminals 10 of the connector 204*a*, the external connector 69 and the connector 63*a*. The tap 85*a* of the accelerator potentiometer 85 is connected to the logic unit LU-2 via each terminal 13 of the sockets 204*a*, 63*a* and the plug 69*a*, and the accelerator potentiometer 85 is connected to the logic unit LU-2 by way of each of the terminals 16 and 18 of the socket 204*a*, the plug 69*a* and the socket 63*a*.

The positive terminal of the battery 73 is connected to the automatic voltage setting circuit AVS by way of the corresponding terminals 27 of the socket 204*a*, the plug 69*a* and the socket 63*a* as is shown in FIGS. 6A and 6C, and at the same time the automatic voltage setting circuit AVS connects the negative terminal of the battery 73 by way of each terminals 29 and 30 of the corresponding connectors. As is shown by a dotted line $11_b$ in FIG. 7, the push-button switch 64*a* is connected between the diode 91*b* and the terminal 38 of the logic unit LU-1 by way of the terminals 9 and 38 of the connector 63 (see FIG. 6B). The push-button switch 64*b* is connected between the terminal 39 of the logic unit LU-1 and the terminal 16 of the logic unit LU-2. As is shown by a dotted line 13*b*, the push-button switch 64*c* is connected between the diode 91*m* and the terminal 21 of the logic unit LU-2. The push-button switch 64*d* is connected between a juncture of a collector electrode of the transistor 95*b* and the capacitor 94*c* and the resistor 93*i* by way of the terminal 42 of the socket 63*b* and the terminal 22 of the socket 63*a* as is shown by a dotted line 12*b* in FIG. 7.

Additionally, it will be observed that, as is best shown in FIGS. 6A and 6C, the terminal 27 of the socket 63*a* connects the positive terminal of the battery 73 to the automatic voltage setting circuit AVS which consists of the constant voltage setting circuit CV and the automatic voltage changeover circuit AD. When the source voltage is E (such as E=36 v), the electric charge is accumulated on the capacitor C51 through the resistor R53. When the charged voltage on the capacitor C51 exceeds the brakedown voltage of the zener diode Z8, the thyristor $SCR_1$ is fired by the gate current from the zener diode Z8, and the conduction of the thyristor $SCR_1$ energizes the relay Ry36. The energization of the relay Ry36 makes the normal closed contact Ry36*a* take the OFF state in the voltage setting circuit CV. When the contact Ry36*a* is in OFF state, the current is supplied to the zener diode Zo from battery 73 of the control circuit for driving the vehicle through the terminal 27 of the socket 63*a* and resistor $RO_1$–$RO_4$ in order to apply the constant voltage to the display circuit.

When the source voltage is 2E, both of the relays Ry36 and Ry72 are energized and thereby both of the normal closed contacts Ry36*a* and Ry72*a* are in the OFF state due to the energization of the relays Ry36 and Ry72. When the contact Ry36*a* and RY72*a* are in the OFF state, current from the battery 73 is supplied to the Zener diode ZO by the aid of the resistor $RO_1$–$RO_6$, and thereby the voltage applied to the display circuit is maintained constant.

It may be understood that, according to the invention, only one testing apparatus is applicable to making an actual test of various kind of electric circuits to be tested each of which has a different power source voltage from the others since the actuating circuit of the testing apparatus has the automatic voltage setting circuit AVS which consists of the constant voltage setting circuit CV for supplying current to the actuating circuit and the automatic voltage changeover circuit AD for applying suitable voltage to the constant voltage setting circuit CV.

In making an actual test of the control circuit of an electrically driven vehicle as shown in FIG. 7, the logic units LU-1 and LU-2 are extracted from the sockets 204*a* and 204*b* of the connctor 204, and thereafter are inserted into the sockets 63*a* and 63*b* of the connector 63. While the external connector 69 of the testor is plugged into the connector 204 of the circuit arrangement of the vehicle. In this case, when any portion of the control circuit to be tested except the logic units LU-1 and LU-2 is malfunctioning, if the logic units LU-1 and LU-2 are plugged into the sockets 63*a* and 63*b* of the connector 63 without noting the malfunction such as, for example, the short-circuit in a loop between the resistor 83 and the negative terminal of the battery 73, the logic units LU-1 and LU-2 are likely to be destroyed. It must, therefore, be checked whether there is a malfunction or not, in the control circuit except the logic units LU-1 and LU-2. The flickering condition of the light emitting diode $ED_G$ must be checked firstly, in order to prevent the destruction of the logic units LU-1 and LU-2. Specifically, when the corresponding terminals 36 and 37 are grounded as is shown in FIG. 5, a circuit loop is formed by the corresponding terminals 27 and P, the resistors $R_{27}$ and $R_{71}$, the light emitting diode $ED_G$, the diodes $D_{72}$ and $D_{71}$ and the corresponding terminals 36(37), and thereby the light emitting diode $ED_G$ is lighted. The logic units LU-1 and LU-2, accordingly, must be plugged into the sockets 63*a* and 63*b* of connector 63 after the confirmation that the diode $ED_G$ is extinguished. When the switch 78F is closed on condition that the logic units LU-1 and LU-2 are respectively plugged in the sockets 63*a* and 63*b* and that the accelerator switch 77*a* is closed, the voltage is supplied from the battery 73 to the corresponding terminals 31 and 32 of the socket 63*b*. The voltage at the terminals 31 and 32 is applied to the base electrode of the transistor $Q_4$ as is apparent from FIG. 6B, and the transistor $Q_4$ become conductive. When the transistor $Q_4$ is conductive, the light emitting diode $ED_4$ is lighted due to the current supplied from the terminal P.

The monitor circuit 87*a* confirms whether there exists a malfunction in the chopper circuit 76 and the accelerator or not as is known in the conventional art, and supplies the gating signal to the first thyristor 81*a* on condition that the chopper circuit 76 and the other circuit portions of the control circuit are in normal condition. When the thyristor 81*a* is fired by the gating signal from the monitor circuit 87*a*, the anode voltage of the thyristor 81*a* becomes approximately zero, and thereby the light emitting diode $ED_4$ is extinguished. The malfunction of the switch 77*a* and the relay 79 can be checked by seeing the flickering of the light emitting diode $ED_4$. When the switch 78F is closed, the voltage is applied to the corresponding terminal 34 and the transistor Q6 is rendered conductive. The conduction of the transistor Q6 makes the light emitting diode $ED_6$ luminesce, and at the same time the voltage is applied to the terminals 36, 37 and 10, and the light emitting diodes $ED_7$ and $ED_1$ luminesce respectively.

Accordingly, it will be judged that the loop formed by the accelerator switch 77*a* and the switch 78F is normal, when the emitting diode $ED_4$ luminesces and is soon after extinguished. In the same manner, the normal condition of the loop from the diodes 82*a* and 82*b* to the resistor 83 can be checked by flickering of the light emitting diode $ED_7$. Further, by seeing the flickering conditions of the light emitting diode $ED_1$, it is easy to check the discontinuity of the resistor 83 and the no-short-circuited state of the loop from the resistor 83 to the resistor 26. In other words, when the light emitting diode $ED_1$ does not luminesce, the discontinuity of the resistor 83 or the short-circuit of the potentiometer 85 may be checked.

As is known in the conventional art, when the mark-space ratio of a chopper circuit 76 attains the preselected value, the relay 84 is energized and the contact 84*a* is closed by making the thyristor 81*b* conductive by means of the signal from the monitor circuit 87*b*, and thereby the chopper circuit 76 is by-passed by the contact 84*a*. When the thyristor 81*b* is non-conductive the light emitting diode $ED_8$ luminesces, since the transistor $Q_8$ becomes conductive by the aid of the voltage applied from the terminal 43 of the socket 63*b* thereto and, on the other hand, when the thyristor 81*b* becomes conductive, the light emitting diode $ED_8$ is extinguished because the potential at the terminal becomes nearly zero. When the light emitting diode $ED_8$ does not luminesce, the abnormal condition is known and, in the same way, the discontinuity of the loop including the contact 77*c* is detected.

When the contact 84*a* is closed, it is desirable that the potential on the capacitor 76*d* of the chopper circuit 76 is positive at the side of the reactor 76*e*. The light emitting diode $ED_{10}$ is employed in order to check the electric charge which is stored in the capacitor 76*d*. When the electric charge accumulated in the capacitor 76*d* is positive at the side of the reactor 76*e*, the voltage is applied to the transistor $Q_{10}$ by way of each terminal 52 of the socket 204*b*, the socket 69*b* and the socket 63*b*, and causes the light emitting diode $ED_{10}$ to luminesce. Further, the light emitting diodes $ED_{3A}$ and $ED_{3B}$ are employed for checking the condition of the tap 85*a* of the potentiometer 85. Specifically, when the tap 85*a* is positioned uppermost as indicated at UL (see FIGS. 5 and 7), the potential at the terminal 13 is high and, in contrast, is low when the tap 85*a* is situated in the lowermost position as indicated by the reference LL. When the tap 85*a* is located at the lowermost position, the transistors $Q_3$, $Q_{3A}$ and $Q_{3B}$ are, therefore, conductive and at the same time the diode $ED_{3A}$ luminesces since the potential at the terminal 13 is high. On the other hand, the emitting diode $ED_{3B}$ is not put on because the diode $ED_{3B}$ is shortcircuited by the transistor $Q_{3B}$, as shown in FIG. 6A. In contrast, the light emitting diode $ED_{3B}$ luminesces when the tap 85*a* is located to the lowermost position as shown by the reference LL, because the transistor $Q_{3B}$ is nonconductive due to the low potential of the terminal 13.

As is explained in the foregoing, the malfunction of each circuit loop may be detected by seeing the flickering of each emitting diode. There is, however, an abnormal condition in which, for instance, the light emitting diodes are continuously lighted in case the thyristor 81*b* does not become conductive. This abnormal condition often occurs from the signals from the monitor circuits 87*a* and 87*b*. As is discussed above, since the monitor circuit 87*a* checks the chopper circuit 76 and the accelerator potentiometer 85 prior to the driving of the vehicle and thereafter generates an output signal, it is necessary to check briefly with reference to the chopper circuit 76 and the accelerator potentiometer 85. Operation of the switch 64*b* (normal closed contact) releases the monitoring of the accelerator potentiometer 85, that is to say, the terminal 16 is disconnected from the terminal 39. In this case, malfunction of the potentiometer 85 can be detected and discriminated if the thyristor 81*a* becomes conductive in spite of the discontinuity between terminal 16 (corresponding to the potentiometer 85) and the terminal 39 (diode 91*c*).

On the other hand, the monitor circuit 87*b* is provided in order to check the advancing of the mark-space ratio of the chopper circuit 76 when the contact 84*a* is not closed. When the chopper circuit 76 malfunctions, the base current is applied to the transistor 95*c* via Zener diode 96*c*, and since the electric charge of the capacitors 94*b* and 94*c* are discharged, the thyristor 81*b* can not become conductive and as a result, the contact 84*a* is not closed. When the contact 84*a* is opened, the light emitting diode $ED_8$ is lighted, as is explained in the foregoing.

On pushing the push-bottom switch 64*c* (normal open contact), as anodes of the diodes 91*h* and 91*j* are connected to the negative terminal of the battery 73 as is shown in FIG. 7, the transistor 95*c* turns off and thereby the electric charges are stored on the capacitors 94*b* and 94*c*. The thyristor 81*b* is fired after the delay time when the capacitors 94*b* and 94*c* are charged up to the breakdown voltage of the Zener diode 96*b*. In this case if the bypass contact 84*a* is closed, it will be understood that a chopper control circuit including oscillating circuit 90 is out of order.

The push-button switch 64*d* (normal closed contact) is connected to the logic unit 87*b* as is best shown in FIG. 7. Further, the push-button switch 64*d* is used for checking the malfunction of the monitor circuit 87*b* itself where, for instance, the thyristor 81*b* cannot turn on, due to short-circuit of transistor 95*c*, the short-circuit of the capacitor or the like. In this like manner, the pre-check of the control circuit of the vehicle can be accomplished swiftly and easily before the actual test by usage of the push-button switches 64*a*, 64*b*, 64*c*, 64*d* and 64*e*.

In a preferred embodiment of the invention, although the testing apparatus is constructed so as to connect the logic units LU-1 and LU-2 to the connector 63 and, at the same time, to connect the external connector 69 to the connector 204 of the circuit assembly to be tested, it will be appreciated that the testing apparatus can be constructed so as to connect the logic unites LU-1 and LU-2 to the external connector 69, by providing a connector instead of the connector 63 on the external connector 69 and so as to connect the external connector 69 to the connector 204. Further, the circuit drawing 62*a* may be written at the indicating panel plate 70*a* according to the invention.

Furthermore, it will be appreciated that, although the preferred embodiment has been described with particular reference to the usage of the indicating lamp which is positioned at the corresponding circuit loop of the displaying panel and which flickers in accordance with the conditions of the test circuit, a voltage meter or a buzzer can be used instead of the indicating lamp which is connected to the corresponding portion of the circuit assembly to be examined.

An advantage over the prior art testing apparatus is that the new testing apparatus provides an easy testing operation and a highly reliable testing result, because all normal and abnormal conditions of the circuit to be tested are distinguishable due to the visual discrimination at the display panel in which the indicating elements are positioned at the check points of each loop of the circuit.

Another advantage of the invention is that since a displaying portion and a connecting member are provided on a surface of a casing and a circuit drawing is provided in a display panel in which check points are visually displayed, the test result can be detected at a glance and clearly.

A further advantage of the invention is that, since a test result is displayed on the corresponding point of the circuit drawing by only replacement of connectors, the testing operation is very simple and easy and, therefore, the testing apparatus is inexpensive and convenient to use.

In view of the above, it will be seen that the several objects of the invention are achieved and other advantageous results attained.

While a preferred embodiment of the invention has been shown and described, it will be apparent to those skilled in the art that modifications can be made without departing from the principles and spirit of the invention, the scope of which is defined in the appended claims. For example, although the invention has been described with particular reference to the testing of an electrically driven vehicle, it will be appreciated that the testing apparatus of the invention may be used to test any apparatus containing simple and/or multiple circuits. It is also to be understood that the teachings of the invention are applicable to situations in which it is necessary to test apparatus or assemblies which are actually moving or running. Accordingly, the foregoing embodiment is to be considered illustrative, rather than restrictive of the invention and those modifications which come within the meaning and range of equivalency of the claims are to be included herein.

What is claimed is:

1. A testing apparatus for testing a control system for controlling an electrically driven vehicle and having a main circuit which includes a battery having positive and negative terminals, an electric motor connected in series to the battery and a chopper circuit which is connected between the motor and the battery for regulating a voltage applied to the electric motor from the battery and a control circuit having relays, logic units including monitor circuits for monitoring the condition of the chopper circuit, and the control circuit and the chopper circuit being divided into a circuit element unit which includes capacitors and reactors and a semiconductor element unit which includes semiconductor elements on an electrical insulating board having a connector member with sockets for electrically connecting the logic units to the circuit elements of the control system, said testing apparatus comprising a displaying panel which includes a drawing of a circuit assembly of the control system to be tested, an indicating lamp member having indicating lamps which are positioned at a portion of said drawing of said circuit assembly, an actuating circuit member for energizing said indicating lamp member, and a connecting member which includes a first connector means having a plurality of terminals for connecting said logic units which are extracted from said sockets of said connector member to said actuating circuit member and a second connector means to be connected to said connector member from which said logic units logic units are extracted from said sockets and for electrically connecting the circuit assembly to be tested to said actuating circuit member and to said logic units first, second and third terminals of said first connector means being connected to the terminals of the battery of the main circuit, said actuating circuit member comprising:

a voltage detecting means electrically connected to said lamp member and a corresponding test point of the control system to be tested by way of said first connector member, for illuminating said lamp member by detecting the potential of said corresponding point, and a voltage setting circuit which comprises a controllably variable constant voltage setting circuit means for applying constant voltage to said lamp member and said voltage detecting member, said constant voltage means including a zener diode connected in parallel to said lamp member and said voltage detecting means, a plurality of series connected resistor elements connected between said zener diode and said first terminal of said first connector means which is to be connected to the battery, and an voltage changeover circuit means for controlling said constant voltage setting circuit to supply a constant current to said voltage detecting means and said indicating lamp member.

2. A testing apparatus as claimed in claim 1 wherein said indicating lamp member includes at least one light emitting diode which is positioned at the corresponding portion of said drawing of said displaying panel corresponding to the position of the test point of said circuit assembly.

3. A testing apparatus as claimed in claim 1 further comprising means for pre-checking the circuit assembly before an actual test of said circuit assembly.

4. A testing apparatus as claimed in claim 1 wherein said first connector means and said second connector means, respectively, include a plurality of terminals.

5. A testing apparatus as claimed in claim 1 wherein said voltage change changeover circuit comprises a first relay circuit including a first relay which is connected to said first terminal of said first connector means to be connected to said positive terminal of the battery and a thyristor connected in series with said first relay, a second relay circuit including a second relay which is connected to said first terminal of the first connector means to be connected to the positive terminal of the battery and a second thyristor connected in series with said second relay, a first relay actuating circuit connected to said first relay circuit in parallel relationship and comprising a normal closed contact of said second relay, a diode, a capacitor and a zener diode connected to the gate electrode of said first thyristor of said first relay circuit, and a second relay actuating circuit connected in parallel to the second relay circuit and comprising a diode, a capacitor and a zener diode to a gate electrode of said thyristor of said second relay circuit.

6. A testing apparatus as claimed in claim 1 wherein said constant voltage setting circuit includes series connected resistor elements connected in parallel with normally closed contacts of said relays, said resistor elements being connected to said first terminal of the first connector means to be connected to the positive terminal of said battery of said control system, and a zener diode connected between said series connected resistor elements and said negative terminal of said battery by way of said second and third terminals of said first connector means.

* * * * *